United States Patent
Ki et al.

(10) Patent No.: US 7,185,312 B2
(45) Date of Patent: Feb. 27, 2007

(54) EXPOSURE METHOD FOR CORRECTING LINE WIDTH VARIATION IN A PHOTOMASK

(75) Inventors: Won-tai Ki, Kyungki-do (KR); Seung-hune Yang, Kyungki-do (KR); Ji-hyeon Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 226 days.

(21) Appl. No.: 10/873,242

(22) Filed: Jun. 23, 2004

(65) Prior Publication Data

US 2004/0229138 A1 Nov. 18, 2004

Related U.S. Application Data

(62) Division of application No. 10/225,417, filed on Aug. 22, 2002, now Pat. No. 6,775,815.

(30) Foreign Application Priority Data

Sep. 19, 2001 (KR) ................. 2001-57979

(51) Int. Cl.
G06F 17/50 (2006.01)
G03C 5/00 (2006.01)

(52) U.S. Cl. .................. 716/20; 716/19; 430/30

(58) Field of Classification Search .............. 716/20; 430/30
See application file for complete search history.

(56) References Cited

U.S. PATENT DOCUMENTS

| | | | |
|---|---|---|---|
| 5,454,054 A * | 9/1995 | Iizuka | 382/321 |
| 5,933,212 A | 8/1999 | Kasuga | |
| 6,296,977 B1 * | 10/2001 | Kaise et al. | 430/30 |
| 6,475,684 B2 | 11/2002 | Ki | |
| 6,541,784 B1 | 4/2003 | Kawano et al. | |
| 6,677,089 B2 * | 1/2004 | Ogino et al. | 430/30 |
| 2003/0093766 A1 | 5/2003 | Liebmann et al. | |

FOREIGN PATENT DOCUMENTS

| | | |
|---|---|---|
| JP | 9297392 | 11/1997 |
| KR | 2001-58315 | 7/2001 |

* cited by examiner

Primary Examiner—Vuthe Siek
Assistant Examiner—Brandon Bowers
(74) Attorney, Agent, or Firm—Volentine & Whitt, P.L.L.C.

(57) ABSTRACT

A method for correcting line width variation occurring during a development process in fabricating a photomask and a recording medium in which the exposure method is recorded is provided, wherein pattern line width variation occurring in a development process with respect to a desirable pattern is estimated, and a corrective exposure is performed using a dose or bias of an electron beam corresponding to the estimated pattern line width variation. Accordingly, pattern line width variation occurring during a development process can be reduced.

8 Claims, 8 Drawing Sheets

EXPOSURE METHOD FOR CORRECTING LINE WIDTH VARIATION IN A PHOTOMASK

CROSS-REFERENCE TO RELATED APPLICATIONS

This is a divisional of U.S. patent application Ser. No. 10/225,417 filed 22 Aug. 2002 now U.S. Pat. No. 6,775,815, the entirety of which is hereby incorporated herein by reference for all purposes as if fully set forth herein.

BACKGROUND

1. Technical Field

The present invention relates to a method of exposing a resist of a photomask substrate to fabricate a photomask used for fabricating a semiconductor device, and more particularly, to an exposure method for correcting line width variation occurring during a development process in fabricating a photomask, and a recording medium in which the exposure method is recorded.

2. Description of the Related Art

Generally, in order to fabricate a photomask used for photolithography, a series of processes using electron beam lithography are performed as follows. First, a blank mask on which an opaque layer and an electron beam resist are sequentially deposited on a transparent photomask substrate made of quartz or glass is prepared. The electron beam resist is then exposed to an electron beam in a desirable pattern using an exposure apparatus. Subsequently, the exposed electron beam resist is developed using a development apparatus. The opaque layer is etched using the electron beam resist pattern as a mask, thereby forming an opaque layer pattern. Thereafter, the electron beam resist pattern is removed, thus completing a photomask.

In such fabrication of a photomask, an opaque layer pattern having a different line width from a desirable critical dimension (CD) is formed due to various factors in the fabrication, and the uniformity of a pattern line width decreases. If photolithography is performed using such photomask having a changing pattern line width or decreasing uniformity due to factors in fabrication, a pattern on a wafer also has changes in line width and decreases in uniformity. Accordingly, a photomask having a changing pattern line width or decreasing uniformity results in a semiconductor defect, thereby decreasing the fabrication yield. Consequently, fabrication cost increases. Therefore, it is necessary to analyze the causes of variations in pattern line width and to perform a corrective exposure.

Representative causes of variations in pattern line width occurring during fabrication are a fogging effect and a loading effect. In a fogging effect, an electron beam resist is diffusely exposed to electron beams reflected from the inside or the surface of an electron beam resist and the bottom of an objective lens of an electron beam emitter, which causes a line width to change. In a loading effect, a line width at a portion having a large loading density (i.e., an exposed area of an opaque layer underlying a removed electron beam resist) is greater than a line width at a portion having a small loading density when the opaque layer is etched.

Existing corrective exposure methods take into account fogging and loading effects. Fogging and loading effects are the causes of a variation in a line width occurring during an exposure process and an opaque layer etching process, respectively, among photomask fabrication processes. However, variation in line width occurring during a development process among the photomask fabrication processes has been neglected. Even if a photomask is fabricated by a corrective exposure method in consideration of fogging and loading effects, there is a limitation in increasing the uniformity of pattern line width. Accordingly, even if line width variation occurring during a development process is small, the line width variation exerts an influence which cannot be neglected in the fabrication of highly integrated circuits.

FIG. 1 is a schematic diagram of a development apparatus for explaining variation in line width during a development process.

Referring to FIG. 1, in a state in which a blank mask 20 is put in the development apparatus such that its exposed surface 25, that is, an electron beam resist exposed by an exposure process, faces upward, a developer 10 is ejected through a nozzle 15 downward. Here, the blank mask 20 is rotated, as denoted by the arrow 30, so that the developer 10 can be uniformly distributed. In other words, a spinning process is a general development process. However, when the developer 10 is ejected while the exposed blank mask 20 is rotated, line width uniformity of an opaque layer pattern changes due to variations in the flow velocity, relative flow rate, and heat of vaporization of the developer 10 on the exposed surface 25 of the blank mask 20. Since a spinning process is the development process, the pattern line width changes in a radial direction during the development process. A variation in the pattern line width during the development process decreases the processing margin of a wafer and weakens the cells at the edge of the wafer. Accordingly, the development of a corrective exposure method overcoming the above problems is desired.

SUMMARY

To solve the above-described problems, it is a first object to provide an exposure method for correcting pattern line width variation occurring during a development process, after electron beam exposure.

It is a second object to provide a recording medium for recording an exposure method for correcting pattern line width variation occurring during a development process.

To achieve the first object in one embodiment, there is provided an exposure method for correcting pattern line width variation. In the method, a measuring pattern is formed on a photomask substrate according to a test pattern having a predetermined line width. The photomask substrate on which the measuring pattern is formed is divided into meshes. The line width of the measuring pattern in each mesh is measured. Pattern line width variation $\Delta CD$, which is a difference between the measured line width and the line width of the test pattern, is determined. Thereafter, a graph of the distribution of pattern line width variation $\Delta CD(r)$ measured for each mesh, separated from a reference mesh by a distance r, is made from the graph. From the graph, pattern line width variation $\Delta CD(x)$ at an arbitrary point, separated from the reference mesh by a distance x on the photomask substrate, is estimated. Pattern line width data is corrected with respect to each point on the photomask substrate such that a pattern line width increases in an area where the estimated pattern line width variation $\Delta CD(x)$ is negative, and a pattern line width decreases in an area where the estimated pattern line width variation $\Delta CD(x)$ is positive. The pattern line width data corrected with respect to each point on the photomask substrate is applied to an exposure apparatus.

To achieve the first object, in another embodiment there is provided an exposure method for correcting pattern line width variation. In the method, a standard deviation σ of pattern line width variation ΔCD(r) is calculated by dividing a photomask substrate into meshes and assuming that the distribution of the pattern line width variation ΔCD(r) for each mesh, which is separated from a reference mesh at the center of the photomask substrate by a distance r, is a Gaussian distribution expressed by the following equation:

$$\Delta CD(r) = A + B \cdot \exp\left[-\frac{r^2}{\sigma^2}\right],$$

wherein A and B are constants.

Thereafter, the calculated standard deviation σ is combined with the above equation, and from the above equation pattern line width variation ΔCD(x) is estimated at an arbitrary point, separated from the reference mesh by a distance x on the photomask substrate. Pattern line width data is corrected with respect to each point on the photomask substrate such that a pattern line width increases in an area where the estimated pattern line width variation ΔCD(x) is negative, and a pattern line width decreases in an area where the estimated pattern line width variation ΔCD(x) is positive. The pattern line width data corrected with respect to each point on the photomask substrate is applied to an exposure apparatus.

Preferably, in calculating the standard deviation, a measuring pattern is formed on the photomask substrate according to a test pattern having a predetermined line width, and a line width of the measuring pattern is measured with respect to each mesh. The pattern line width variation ΔCD(r), which is a difference between the measured line width and the line width of the test pattern, is determined. An arbitrary σ is selected and combined with the equation to calculate pattern line width variation for each mesh. A deviation between the calculated pattern line width variation and the measured pattern line width variation ΔCD(r) is calculated to determine the value for σ that minimizes the deviation.

To achieve the second object, in one embodiment there is provided a computer-readable recording medium for recording an exposure method for correcting pattern line width variation in the form of a program. The program includes a program module for dividing a photomask substrate into meshes and making a graph of the distribution of pattern line width variation ΔCD(r) for each mesh separated from a reference mesh by a distance r; a program module for estimating from the graph pattern line width variation ΔCD(x) at an arbitrary point, separated from the reference mesh by a distance x on the photomask substrate; a program module for correcting pattern line width data with respect to each point on the photomask substrate such that a pattern line width increases in an area where the estimated pattern line width variation ΔCD(x) is negative, and a pattern line width decreases in an area where the estimated pattern line width variation ΔCD(x) is positive; and a program module for operating an exposure apparatus according to the pattern line width data corrected with respect to each point on the photomask substrate to expose an electron beam resist on the photomask substrate.

To achieve the second object, in another embodiment there is provided a computer-readable recording medium for recording an exposure method for correcting pattern line width variation in the form of a program. The program includes a program module for calculating a standard deviation a of pattern line width variation ΔCD(r) by dividing a photomask substrate into meshes and assuming that the distribution of the pattern line width variation ΔCD(r) in each mesh, which is separated from a reference mesh at the center of the photomask substrate by a distance r, is a Gaussian distribution expressed by the following equation:

$$\Delta CD(r) = A + B \cdot \exp\left[-\frac{r^2}{\sigma^2}\right],$$

wherein A and B are constants.

The program also includes a program module for combining the calculated standard deviation σ with the above equation and, from the above equation, estimating pattern by a distance x on the photomask substrate; a program module for correcting pattern line width data with respect to each point on the photomask substrate such that a pattern line width increases in an area where the estimated pattern line width variation ΔCD(x) is negative, and a pattern line width decreases in an area where the estimated pattern line width variation ΔCD(x) is positive; and a program module for operating an exposure apparatus according to the pattern line width data corrected with respect to each point on the photomask substrate to expose an electron beam resist on the photomask substrate.

The program module for calculating may include a sub program module for receiving the pattern line width variation ΔCD(r), which is a difference between a line width measured in a measuring pattern, which is formed on the photomask substrate according to a test pattern having a predetermined line width, and the line width of the test pattern with respect to each mesh; a sub program module for selecting and combining an arbitrary σ with the equation and calculating pattern line width variation with respect to each mesh; and a sub program module for calculating a deviation between the calculated pattern line width variation and the received pattern line width variation ΔCD(r), and determining the value of σ at which the deviation is minimized.

As disclosed herein, pattern line width variation occurring in a development process with respect to a desirable pattern in fabricating a photomask is estimated, and a corrective exposure is performed so that the estimated pattern line width variation can be corrected, thereby reducing pattern line width variation occurring during the development process. Therefore, the problems of reduction in the processing margin of a wafer and weak cells at the edge of the wafer due to variation in a pattern line width occurring during the development process can be overcome.

BRIEF DESCRIPTION OF THE DRAWINGS

The above object and advantages will become more apparent by describing in detail an embodiment with reference to the attached drawings in which.

DETAILED DESCRIPTION

Figure 1:
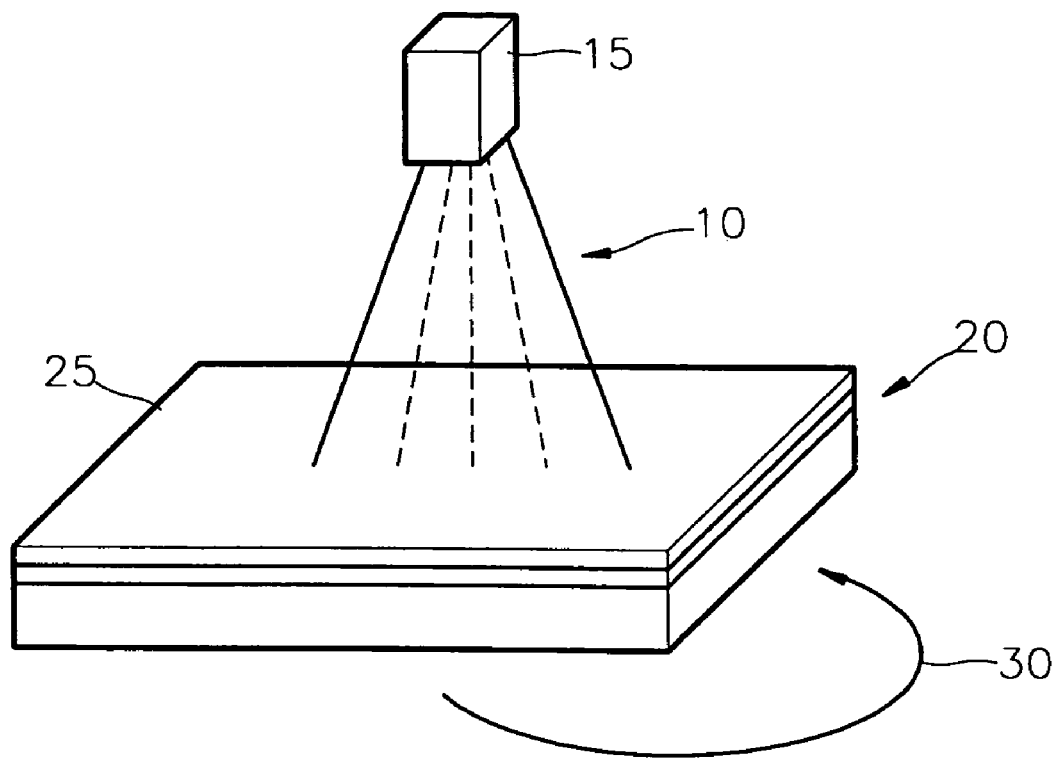
FIG. 1 is a schematic diagram of a development apparatus for explaining a variation in a line width during a development process in fabricating a photomask.

Hereinafter, an embodiment of the present invention will be described in detail with reference to FIGS. 2 through 6. The present invention is not restricted to the following embodiment, and many variations are possible within the spirit and scope of the present invention. The embodiment of the present invention is provided in order to more completely explain the present invention to anyone skilled in the art. In the drawings, the same reference numerals denote the same member.

Figure 2:
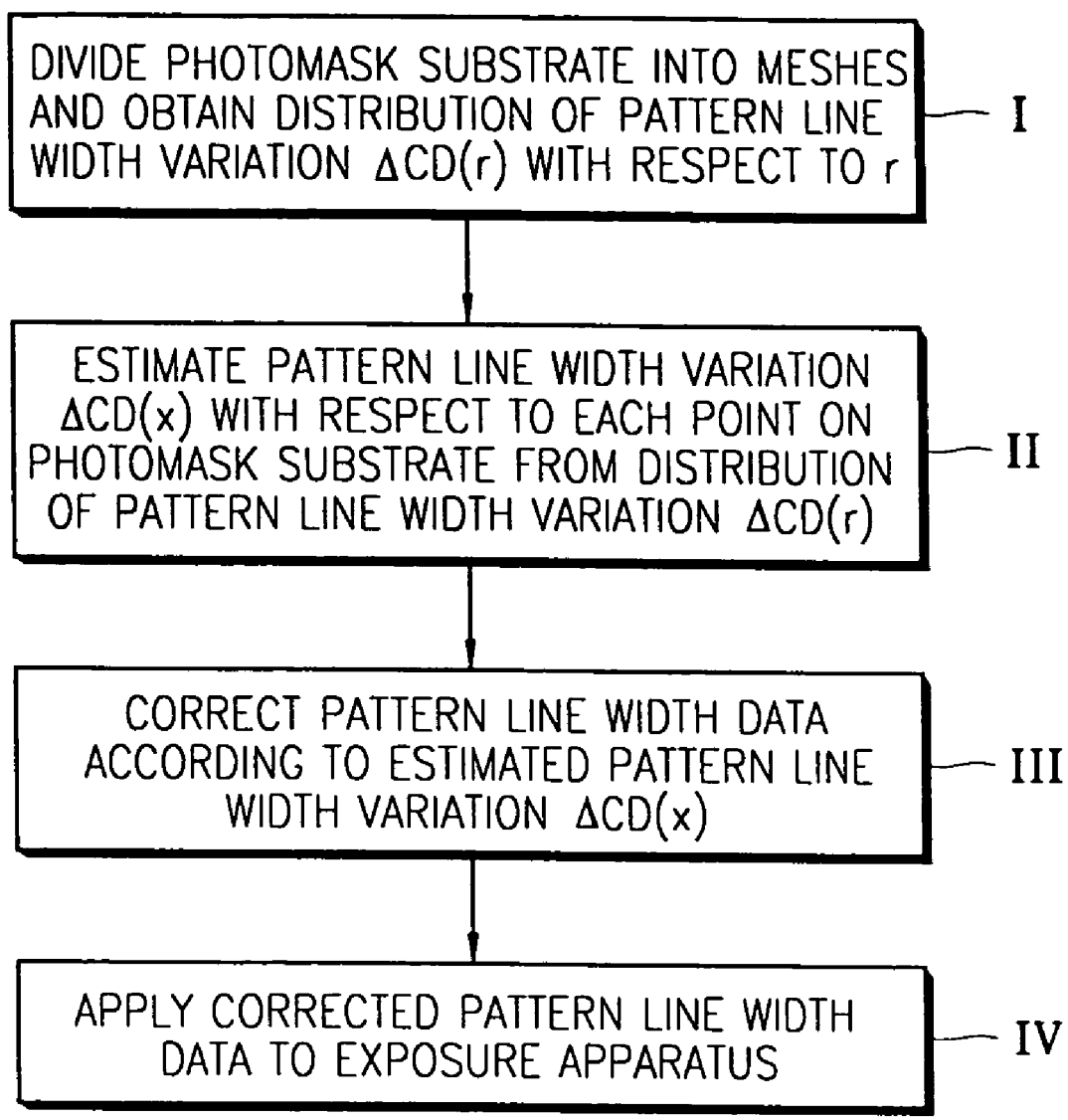
FIG. 2 is a flowchart of an exposure method for correcting line width variation occurring during a development process in fabricating a photomask according to an embodiment of the present invention.

The embodiment of the present invention relates to a method of exposing an electron beam resist on a photomask substrate, and more particularly, to an exposure method for correcting line width variation occurring during a development process in fabricating a photomask. FIG. 2 is a flowchart of an exposure method for correcting line width variation occurring during a development process in fabricating a photomask according to the embodiment of the present invention.

Step I

Referring to FIG. 2, a photomask substrate is divided into meshes, and with respect to a distance r, the distribution of pattern line width variation $\Delta CD(r)$ in each mesh, which is separated from an arbitrary reference mesh by the distance r, is obtained. The distribution of pattern line width variation $\Delta CD(r)$ is obtained by the following steps.

Figure 3:
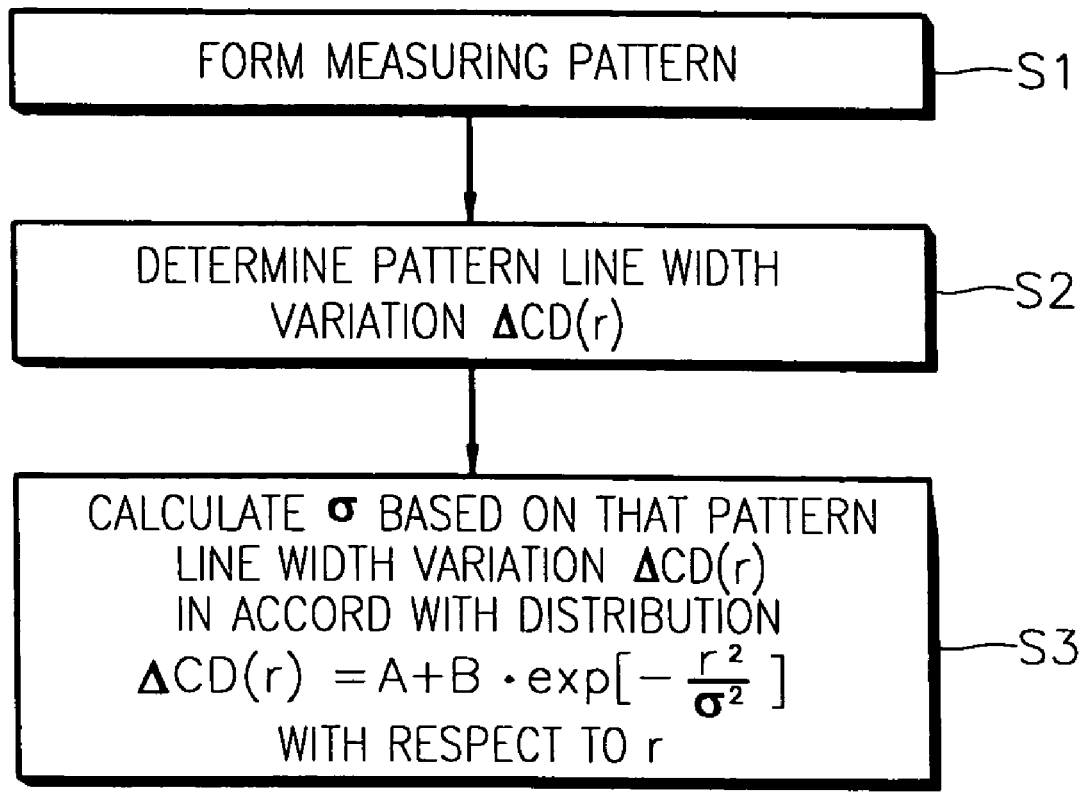
FIG. 3 is a flowchart of a method of obtaining the distribution of line width variation with respect to a measuring pattern according to the embodiment of the present invention.

Referring to FIG. 3, in obtaining the distribution of pattern line width variation $\Delta CD(r)$, in step S1 a measuring pattern is formed by performing exposure, development, and etching on a photomask substrate according to a test pattern having a predetermined line width. In step S2, the photomask substrate on which the measuring pattern is formed is divided into meshes, a line width of the measuring pattern with respect to each mesh is measured, and a difference between the measured line width and the line width of the test pattern, i.e., a pattern line width variation $\Delta CD(r)$, is determined. Here, if a mesh at the center of the photomask substrate is selected as the reference mesh, it can be assumed that the distribution of pattern line width variation $\Delta CD(r)$ in each mesh, which is separated from the reference mesh by the distance r, with respect to the distance r is a Gaussian distribution expressed by Equation (1).

$$\Delta CD(r) = A + B \cdot \exp\left[-\frac{r^2}{\sigma^2}\right] \quad (1)$$

Here, A and B are constants.

The meaning of Equation (1) is as follows. As described above, since a spinning process is a general development process, the line width changes in a radial direction with respect to the center of a photomask substrate during the development process. Accordingly, since pattern line width variation occurring at an arbitrary point on the photomask substrate due to spinning decreases exponentially according to the distance between the arbitrary point and the center of the photomask substrate, the distribution of the pattern line width variation can be quantitatively determined as a Gaussian distribution.

After pattern line width variation with respect to each mesh is determined, the standard deviation $\sigma$ in Equation (1) is calculated in step S3. More specifically, an arbitrary $\sigma$ is selected and applied to Equation (1). Different distances of r are applied to Equation (1) to which the arbitrary $\sigma$ is applied, thereby calculating the pattern line width variation with respect to each mesh. Subsequently, a difference between the calculated pattern line width variation and the determined pattern line width variation is calculated. The above step of selecting an arbitrary $\sigma$ and calculating the difference is repeated until the minimum difference is obtained from an arbitrary $\sigma$. Preferably, an arbitrary $\sigma$ minimizing the difference is obtained using a least square method. In other words, when the sum of squares of differences obtained with respect to different distances of r is minimum, $\sigma$ is determined as the standard deviation of Equation (1).

The following description concerns an example for explaining in detail the steps of dividing a photomask substrate into meshes and obtaining the distribution of pattern line width variation $\Delta CD(r)$ in meshes, which are separated from a reference mesh at the center of the photomask substrate by a distance r, with respect to the distance r.

Figure 4:
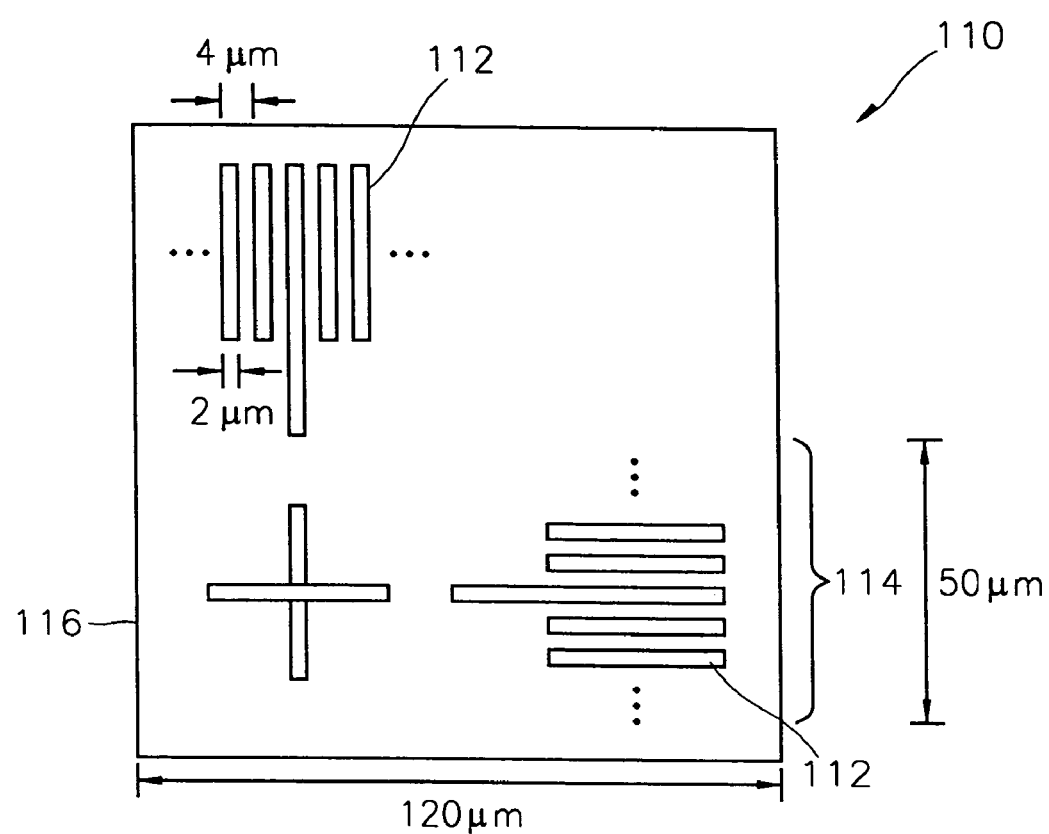
FIG. 4 illustrates a test pattern used in the embodiment of the present invention.
Figure 5:
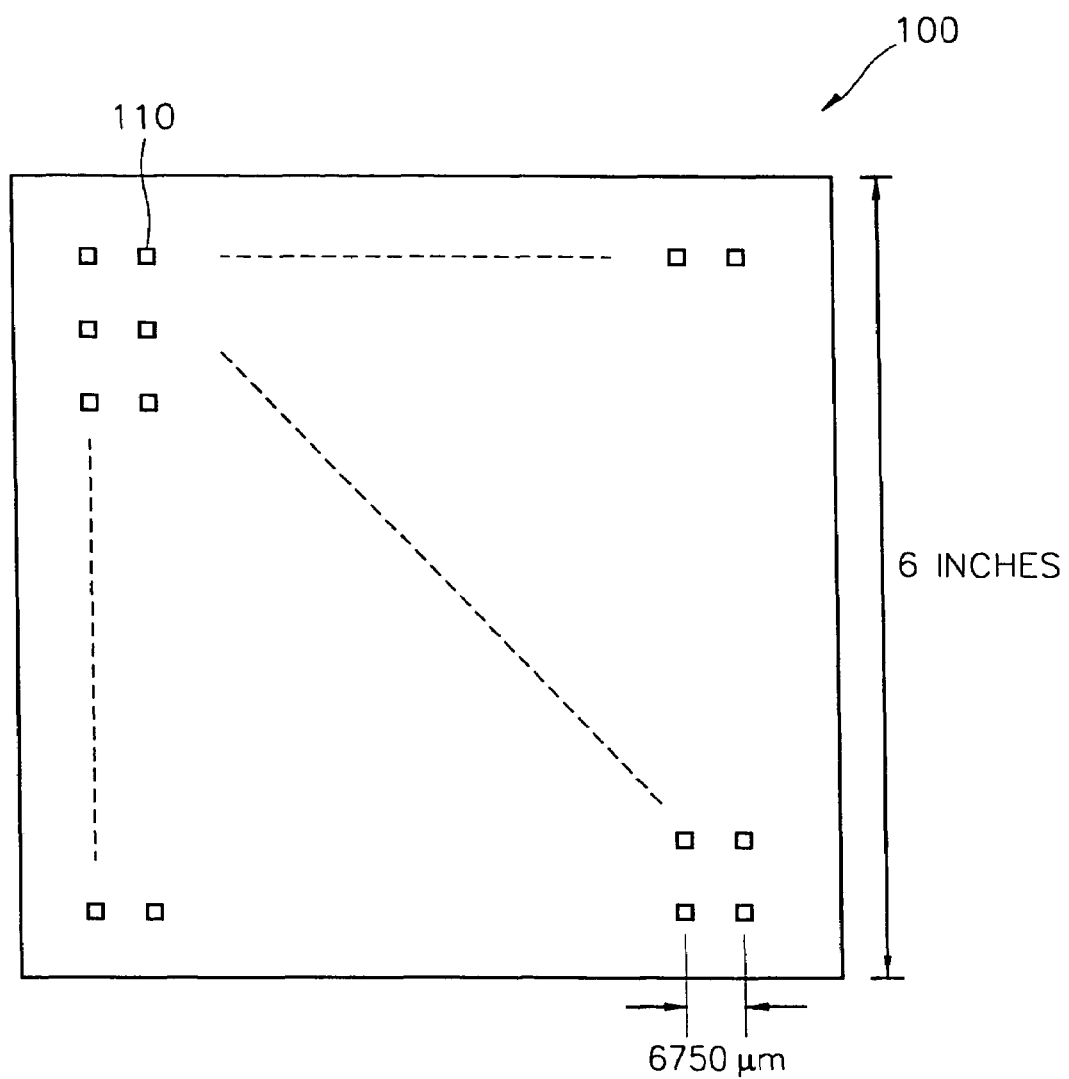
FIG. 5 illustrates the array of test patterns shown in FIG. 4 on a photomask substrate.

FIG. 4 illustrates a test pattern used in the embodiment. FIG. 5 illustrates an array of test patterns shown in FIG. 4 on a photomask substrate.

As shown in FIG. 4, a test pattern 110 includes reference patterns 112 having a line width of 2 µm and a predetermined length and spaced apart at intervals of 4 µm, and a frame 116. 13 reference patterns 112 constitute one bundle 114 having a width of 50 µm. The test pattern 110 may be composed of only one bundle 114. In this embodiment, the test pattern 110 is composed of two bundles 114. The frame 116 is a square frame with sides of 120 µm in length. The line widths of the reference patterns 112 in the test pattern are to be measured in the following processes.

FIG. 5 shows a photomask substrate 100 on which test patterns 110 are arrayed. As shown in FIG. 5, the photomask substrate 100 is a square substrate with sides of 6 inches in length. Test patterns 110 to be exposed are arrayed 21 columns and 21 rows on the photomask substrate 100. The test patterns 110 are arrayed at intervals of 6750 µm.

The test pattern 110 and the array of the test patterns 110 described above are simple, but the present invention is not restricted to the above-described embodiment and can be applied to various types of test patterns and various types of arrays of test patterns.

An electron beam resist on the photomask substrate 100 is exposed using the test pattern 110 and the array of the test patterns 110 described in FIGS. 4 and 5, and development and etching processes are performed, thereby forming a measuring pattern. More specifically, a blank mask is prepared by sequentially depositing an opaque layer and an electron beam resist on a transparent photomask substrate made of quartz or glass. The electron beam resist is exposed using the test pattern 110 and the array of the test patterns 110. Here, a corrective exposure in consideration of fogging and loading effects can be performed so that the pattern line width variation occurring during a development process will be clearly visible. Subsequently, the exposed electron beam resist is developed using a spinning process according to a typical method. Then, the opaque layer is etched in the pattern of the developed electron beam resist, and the electron beam resist is removed, thereby completing a measuring pattern.

Figure 6:
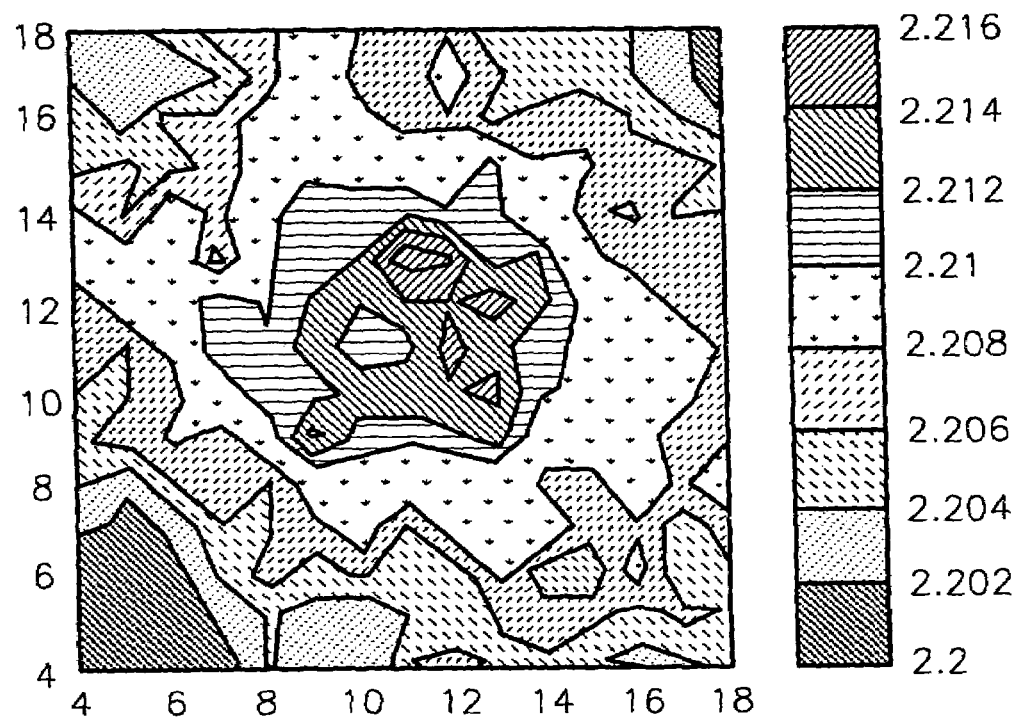
FIG. 6 is a critical dimension (CD) uniformity map with respect to line widths of a measuring pattern formed on a photomask substrate by performing exposure, development, and etching according to the test pattern shown in FIGS. 4 and 5.

The photomask substrate 100 on which the measuring pattern is formed is divided into meshes, and the line widths of the measuring pattern in each mesh are measured. FIG. 6 is a critical dimension (CD) uniformity map with respect to line widths of the measuring pattern. The uniformity map is plotted by dividing the columns and rows of the photomask substrate 100 into 21 meshes, measuring a line width of the measuring pattern 110 in each of the meshes, and grouping meshes having the same line width. Then, the resulting line width is the average measured for all meshes. In this embodiment of the present invention, the columns and rows of the photomask substrate 100 are divided into 21 meshes, and the size of each mesh must be determined in consideration of the size of a line width to be measured. In FIG. 6, the first through third meshes and the nineteenth through twenty-first meshes at the edge of the photomask substrate 100 are excluded, and only the remaining inner meshes (fourth through eighteenth meshes) are shown.

Areas filled with the same pattern on the uniformity map have the same line width. In other words, in the measuring pattern 110, an area denoted by the same pattern has the same line width on the photomask substrate 100. As the number of areas filled with different patterns increases on the uniformity map, the uniformity of a line width of the measuring pattern 110 decreases. Referring to FIG. 6, an area filled with the same pattern is radially distributed around the center of the photomask substrate 100, and eight different areas exist on the photomask substrate 100. As described above, the reason an area filled with the same pattern is radially distributed is that a blank mask is rotated during a development process. The reason different areas exist is that the flow velocity, relative flow rate, or heat of vaporization of the developer is different at different areas on an exposed blank mask loaded on a development apparatus. Referring to FIG. 6, the maximum line width of the measuring pattern 110 is 2.216 μm, and the minimum line width of the measuring pattern 110 is 2.2 μm. In this case, a triple standard deviation value (typically referred to as a CD error) for 99.73% of measurements is about 10.4 nm.

Figure 7:
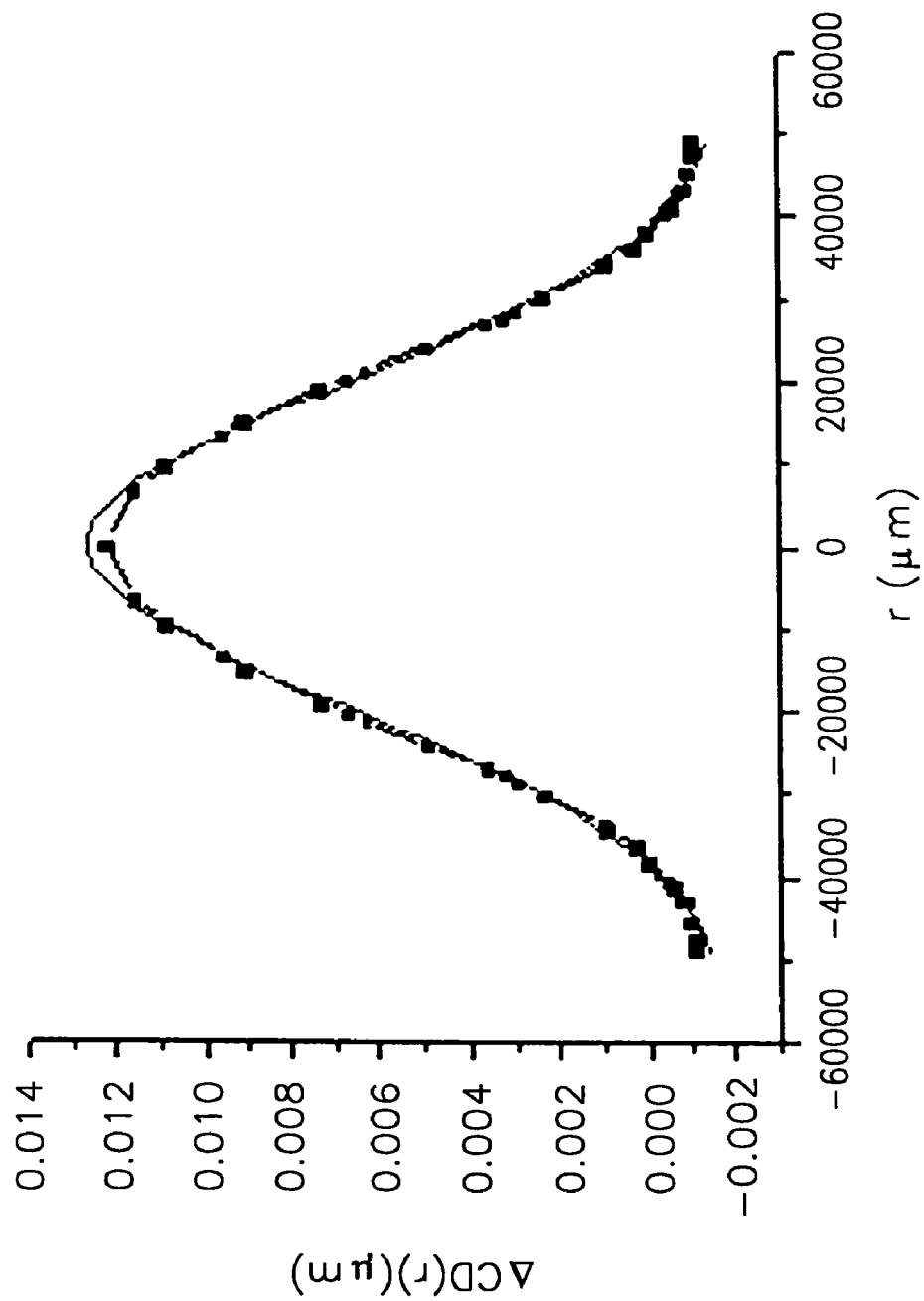
FIG. 7 is a graph of the distribution of line width variation with respect to a measuring pattern according to the embodiment of the present invention.

Next, the pattern line width variation ΔCD, a difference between the line with of the measuring pattern and the line width of the test pattern, is determined. A mesh at the center of the photomask substrate is selected as a reference mesh. A graph of the distribution of pattern line width variation ΔCD(r) at meshes separated from the reference mesh by a distance r is shown in FIG. 7. As shown in FIG. 7, it can be assumed that the distribution of pattern line width variation ΔCD(r) with respect to the distance r is a Gaussian distribution expressed by Equation (1). Next, the standard deviation σ in Equation (1) is calculated by a least square method. More specifically, while changing σ, the pattern line width variation calculated from Equation (1) is compared with the pattern line width variation determined through actual measurement, so σ at which the sum of the squares of the differences between the pattern line width variation calculated from Equation (1) and the pattern line width variation determined through actual measurement in every mesh is minimum is determined as the standard deviation σ of Equation (1).

It is convenient to perform the above procedure of obtaining the standard deviation σ using a computer program. At the beginning of the computer program, a photomask substrate is divided into meshes, and data about pattern line widths measured for the individual meshes is input. For this, data on each of the test patterns and the array of the test patterns should be input into a computer. An arbitrary value of σ is selected and applied to Equation (1), thereby calculating pattern line width variation for each mesh. Next, a difference between the calculated pattern line width variation and measured pattern line width variation is obtained with respect to each mesh. In other words, using a least square method, Equation (1) is repeatedly calculated in response to the application of a predetermined displacement to an initially selected σ, and the squares of differences between the calculated pattern line width variation and the measured pattern line width variation at the individual meshes are summed, so a value of σ at which the sum of the squares is minimum is found. During this procedure, the constants A and B are also obtained.

The standard deviation σ obtained through the above procedure in this embodiment is about 40,000 μm. The constant A is −0.00208 nm, and is thus considered about 0. The constant B is 13 nm.

Step II

Pattern line width variation ΔCD(x) with respect to each point on the photomask substrate is estimated from the distribution of pattern line width variation ΔCD(r) obtained through the above procedure using the test pattern. In other words, the values of σ, A, and B obtained in step I are combined with Equation (1) as in Equation (2).

$$\Delta CD(r) = 13 \cdot \exp\left[-\frac{r^2}{40000^2}\right] \quad (2)$$

Here, the unit of r is μm, and the unit of ΔCD(r) is nm. An arbitrary x is substituted for r to estimate pattern line width variation ΔCD(x) with respect to each point on the photomask substrate.

STEP III

Pattern line width data is corrected according to the pattern line width variation estimated in step II. A dose E(x) of an electron beam during exposure at an arbitrary point separated from the reference mesh by a distance x on the photomask substrate can be determined by Equation (3) according to the pattern line width variation ΔCD(x) estimated from Equation (2) with respect to a reference dose $E_0$.

$$E(x) = E_0 \cdot \frac{\Delta CD(x)\max - \Delta CD(x)}{\Delta CD(x)\max} \quad (3)$$

Here, $\Delta CD(x)$max indicates the maximum of the estimated pattern line width variation. The reference dose $E_0$ can be set to an appropriate value obtained through a test, but it can also be restricted to a certain value considering pattern line width variation in response to a change in a unit dose. Pattern line width variation responding to a change in a unit dose is referred to as a dose margin, is a variable indicating variation in a line width for a percent variation in the dose, and is expressed in a unit of nm/ % dose. Accordingly, when a dose margin is known, dose variation for a correction of exposure can be calculated using the measured variation in a line width. For example, when a dose margin is 2 nm/ % dose, a dose variation of 0.5% is required in order to accomplish a variation of 1 nm in a line width. Here, the reference dose is 0.5% of a dose before the correction. In this embodiment, as shown in FIG. 7, $\Delta CD(x)$max is 13 nm, so a maximum of dose variation is 6.5%.

Instead of a method of changing the dose, a pattern line width in an area where the estimated pattern line width variation $\Delta CD(x)$ is negative can be corrected in a large quantity by applying a positive bias to pattern line width data with respect to an area where the estimated pattern line width variation $\Delta CD(x)$ is negative, and a pattern line width in an area where the estimated pattern line width variation $\Delta CD(x)$ is positive can be corrected in a small quantity by applying a negative bias to pattern line width data with respect to an area where the estimated pattern line width variation $\Delta CD(x)$ is positive. This can be expressed by Equation (4)

$$\text{Bias} = -\{\Delta CD(x)\} \quad (4)$$

Step IV

The pattern line width data corrected in step III is applied to an exposure apparatus to perform a corrective exposure. By performing the corrective exposure, line width variation at each point on the photomask substrate occurring during a development process can be reduced.

Hereinafter, an example of performing a corrective exposure using a method of changing a dose will be described. The corrective exposure was performed on a pattern as shown in FIGS. 4 and 5.

An electron beam resist of a blank mask was primarily exposed to an electron beam at a dose of 8 $\mu C/cm^2$ in the above pattern. Here, the exposure apparatus was a Toshiba EBM-3000 that presents very small line width variation due to electron beam re-scattering, so the line width variation due to electron beam re-scattering can be ignored. Next, a reference dose was set to 0.52 $\mu C/cm^2$, which corresponds to 6.5% of the primary exposure dose, and a photomask substrate was correctively exposed according to Equation (3). Subsequently, the exposed electron beam resist was developed using a development apparatus, and an opaque layer was etched using the electron beam resist designed in a desirable pattern as a mask to form an opaque layer pattern. The electron beam resist pattern was then removed, thereby completing a photomask.

Figure 8:
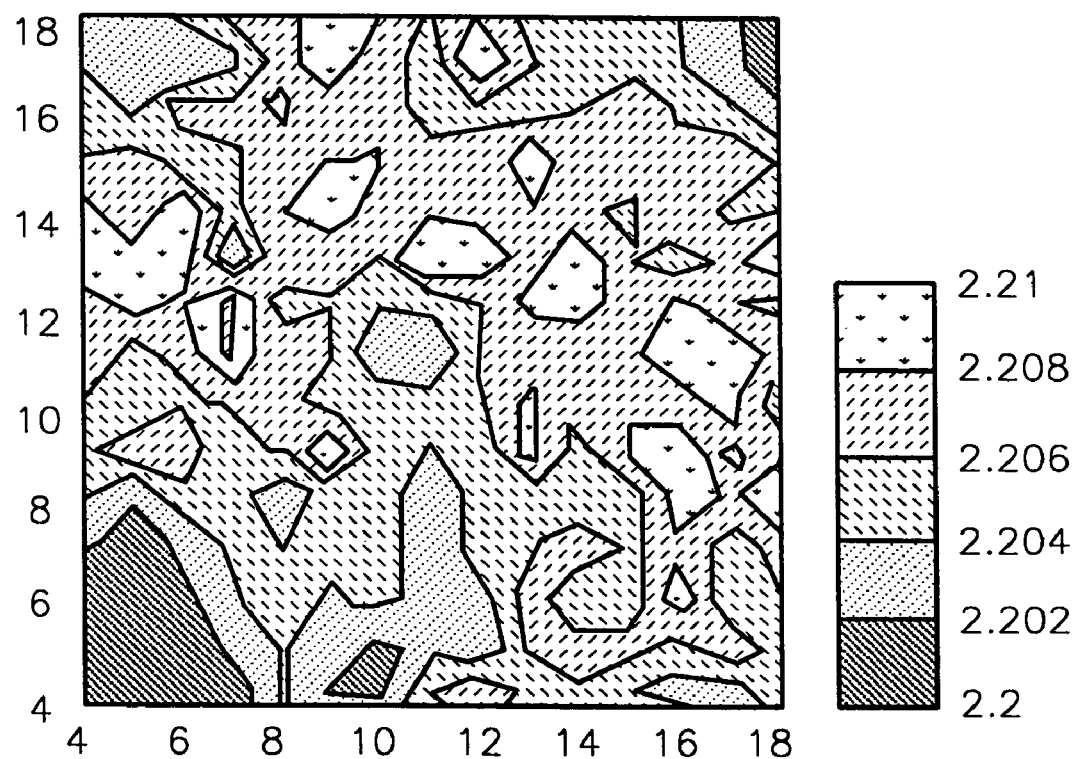
FIG. 8 is a CD uniformity map with respect to pattern line widths of a photoresist substrate which has undergone a corrective exposure according to an embodiment of the present invention, development, and etching.

FIG. 8 is a CD uniformity map with respect to pattern line widths of a photoresist substrate which has undergone a corrective exposure according to an embodiment of the present invention, development, and etching. In this embodiment of the present invention, the columns and rows of the photomask substrate are divided into 21 meshes. In FIG. 8, the first through third meshes and nineteenth through twenty-first meshes at the edge of the photomask substrate are excluded, and the remaining inner meshes (i.e., the fourth through eighteenth meshes) are denoted.

Referring to FIG. 8, there are five different areas. In a portion of the photomask substrate on which corrective exposure has been performed, the maximum line width is about 2.21 $\mu m$, and the minimum line width is about 2.2 $\mu m$. The CD error is about 6.6 nm. In the case of the measuring pattern 110 formed without a corrective exposure, the maximum line width is about 2.216 $\mu m$, the minimum line width is about 2.2 $\mu m$, and the CD error is 10.4 nm. Accordingly, when a corrective exposure is performed, a line width range, i.e., a difference between the maximum line width and the minimum line width, is reduced. In addition, the CD error is reduced. Therefore, it can be inferred that the corrective exposure based on pattern line width variation estimated from Equation (2) in this embodiment can compensate for line width variation occurring during a development process, thereby improving the uniformity of a line width. Particularly, a circular area shown in FIG. 6 is not shown in a central portion actually used as a mask, and there are only five different areas in FIG. 8. Accordingly, in comparison with FIG. 6, the uniformity is remarkably improved in FIG. 8. The CD error in a portion except for the corners of the photomask substrate can be decreased to a value in the rage of 4–5 nm.

A method of correcting line width variation according to the present invention can be embodied as a computer program. The program can be provided through a computer-readable recording medium. In addition, the program can be read from the recording medium and executed in a universal digital computer. Accordingly, since the program can be executed in a digital computer installed in an exposure apparatus, the present invention can be more easily implemented. The recording medium includes a storage medium such as a magnetic storage medium (for example, floppy disc, or hard disc), an optical recording medium (for example, a CD-ROM or DVD), or a carrier wave (for example, a signal transmitted through the Internet).

Recorded on the recording medium are a program module for dividing a photomask substrate into meshes, assuming that the distribution of pattern line width variation $\Delta CD(r)$ at the individual meshes separated from a reference mesh at the center of the photomask substrate by a distance r is a Gaussian distribution expressed by Equation (1), and calculating the standard deviation $\sigma$ of the pattern line width variation $\Delta CD(r)$; and a program module for combining the calculated standard deviation $\sigma$ with Equation (1) and estimating pattern line width variation $\Delta CD(x)$ at an arbitrary point separated from the reference mesh by a distance x on the photomask substrate from Equation (1).

The program module for calculating the standard deviation a includes a sub program module for receiving the pattern line width variation $\Delta CD(r)$, i.e., a difference between a line width measured in a measuring pattern, which is formed by exposing, developing, and etching the photomask substrate using a test pattern having a predetermined line width, and the line width of the test pattern with respect to each mesh; a sub program module for selecting and combining an arbitrary $\sigma$ with Equation (1) and calculating pattern line width variation with respect to each mesh; and a sub program module for calculating a deviation between the calculated pattern line width variation and the received pattern line width variation ΔCD(r) and determining σ at which the deviation is minimum.

In addition, recorded on the recording medium is a program module for correcting pattern line width data with respect to each point on the photomask substrate such that a pattern line width increases in an area where the estimated pattern line width variation ΔCD(x) is negative, and a pattern line width decreases in an area where the estimated pattern line width variation ΔCD(x) is positive. Here, the reference dose and pattern line width variation in Equation (3) can be separately provided from the outside or can be provided through calculation.

Moreover, a program module for operating an exposure apparatus according to pattern line width data corrected with respect to each point on the photomask substrate to expose an electron beam resist on the photomask substrate is recorded on the recording medium. Accordingly, when the recording medium is loaded on and read by a computer operating an exposure apparatus, data for corrective exposure of the exposure apparatus is generated, so the exposure apparatus can be operated based on the generated data. Here, a functional program code, into which each program module is encoded, and code segments can be easily made by programmers skilled in the art.

While the present invention has been particularly described with reference to a preferred embodiment thereof, the present invention is not limited to the preferred embodiment. It will be understood by those skilled in the art that various changes can be made therein without departing from the spirit and scope of the present invention. For example, it has been explained in the above embodiment that a mesh at the center of a photomask substrate is selected as a reference mesh and the distribution of pattern line width variations occurring during a development process is assumed to follow a Gaussian distribution. However, instead of the mesh at the center of the photomask substrate, any mesh on the photomask substrate can be selected as the reference mesh. Here, since the distribution of pattern line width variation may not follow a Gaussian distribution, a method can be used of plotting the distribution of actually measured pattern line width variation to a graph, and from the graph estimating pattern line width variation at a point for which pattern line width variation is not actually measured.

As described above, pattern line width variation to occur during a development process is estimated during fabrication of a photomask, pattern line width data for the photomask is corrected in advance, and exposure is performed based on the corrected pattern line width data. Therefore, line width variation occurring during a development process can be minimized, and a CD error can be reduced, thereby improving the uniformity of a line width. Consequently, microscopic lines of a uniform width can be embedded in highly integrated circuits.

In addition, a method of correcting line width variation as disclosed herein can be embodied as a computer program and executed in a universal digital computer, so the method can be easily implemented.

Therefore, high-accuracy and high-quality photomasks can be fabricated, and the yield of fabrication and the reliability of semiconductor devices can be increased.

What is claimed is:

1. An exposure method for correcting pattern line width variation occurring during a development process in fabricating a photomask, the method comprising:

forming a measuring pattern on a photomask substrate according to a test pattern having a predetermined line width;

dividing the photomask substrate on which the measuring pattern is formed into meshes, measuring a line width of the measuring pattern in each mesh, and determining a pattern line width variation ΔCD, which is a difference between the measured line width and the set line width of the test pattern;

making a graph of a distribution of pattern line width variation ΔCD(r) measured for each mesh, separated from a reference mesh by a distance r;

from the graph, estimating a pattern line width variation ΔCD(x) at an arbitrary point, separated from the reference mesh by a distance x on the photomask substrate;

correcting pattern line width data with respect to each point on the photomask substrate such that a pattern line width increases in an area where the estimated pattern line width variation ΔCD(x) is negative, and a pattern line width decreases in an area where the estimated pattern line width variation ΔCD(x) is positive; and applying to an exposure apparatus the pattern line width data corrected with respect to each point on the photomask substrate.

2. The exposure method of claim 1, wherein a mesh at the center of the photomask substrate is selected as the reference mesh.

3. The exposure method of claim 1, wherein correcting the pattern line width data comprises determining a dose E(x) of an electron beam during exposure at the arbitrary point, using the following equation according to the pattern line width variation ΔCD(x) estimated with respect to a reference dose $E_0$:

$$E(x) = E_0 \cdot \frac{\Delta CD(x)\max - \Delta CD(x)}{\Delta CD(x)\max},$$

wherein ΔCD(x)max indicates a maximum of the estimated pattern line width variation.

4. The exposure method of claim 1, wherein correcting the pattern line width data comprises correcting a pattern line width in an area where the estimated pattern line width variation ΔCD (x) is negative by applying a positive bias to the pattern line width data with respect to the area where the estimated pattern line width variation ΔCD(x) is negative, and correcting a pattern line width in an area where the estimated pattern line width variation ΔCD(x) is positive by applying a negative bias to the pattern line width data with respect to the area where the estimated pattern line width variation ΔCD(x) is positive, as expressed by Bias=−{ΔCD(x)}.

5. A computer-readable recording medium in which an exposure method for correcting pattern line width variation occurring during a development process in fabricating a photomask is recorded in the form of a program, the program comprising:

a program module for dividing a photomask substrate into meshes and making a graph of the distribution of a pattern line width variation ΔCD(r) for each mesh separated from a reference mesh by a distance r;

a program module for estimating from the graph a pattern line width variation ΔCD(x) at an arbitrary point, separated from the reference mesh by a distance x, on the photomask substrate;

a program module for correcting pattern line width data with respect to each point on the photomask substrate such that a pattern line width increases in an area where the estimated pattern line width variation $\Delta CD(x)$ is negative, and a pattern line width decreases in an area where the estimated pattern line width variation $\Delta CD(x)$ is positive; and a program module for operating an exposure apparatus according to the pattern line width data corrected with respect to each point on the photomask substrate to expose an electron beam resist on the photomask substrate.

6. The computer-readable recording medium of claim 5, wherein a mesh at the center of the photomask substrate is selected as the reference mesh.

7. The computer-readable recording medium of claim 5, wherein the program module for correcting comprises determining a dose $E(x)$ of an electron beam during exposure at the arbitrary point, using the following equation according to the pattern line width variation $\Delta CD(x)$ estimated with respect to a reference dose $E_0$:

$$E(x) = E_0 \cdot \frac{\Delta CD(x)\mathrm{max} - \Delta CD(x)}{\Delta CD(x)\mathrm{max}},$$

wherein $\Delta CD(x)\mathrm{max}$ indicates a maximum of the estimated pattern line width variation.

8. The computer-readable recording medium of claim 5, wherein the program module for correcting comprises correcting a pattern line width in an area where the estimated pattern line width variation $\Delta CD(x)$ is negative by applying a positive bias to the pattern line width data with respect to the area where the estimated pattern line width variation $\Delta CD(x)$ is negative, and correcting a pattern line width in an area where the estimated pattern line width variation $\Delta CD(x)$ is positive by applying a negative bias to the pattern line width data with respect to the area where the estimated pattern line width variation $\Delta CD(x)$ is positive, as expressed by Bias=$-\{\Delta CD(x)\}$.

* * * * *